United States Patent
Bian

(10) Patent No.: US 7,988,878 B2
(45) Date of Patent: Aug. 2, 2011

(54) SELECTIVE BARRIER SLURRY FOR CHEMICAL MECHANICAL POLISHING

(75) Inventor: Jinru Bian, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 444 days.

(21) Appl. No.: 10/952,999

(22) Filed: Sep. 29, 2004

(65) Prior Publication Data

US 2006/0068589 A1    Mar. 30, 2006

(51) Int. Cl.
*C09K 13/00* (2006.01)
(52) U.S. Cl. .................. 252/79.1; 252/79.2; 438/754
(58) Field of Classification Search ........... 252/79.1, 252/79.2, 79.3, 79.4, 2; 438/691, 692, 693, 438/492, 754, 745; 216/89
See application file for complete search history.

(56) References Cited

U.S. PATENT DOCUMENTS

| | | | |
|---|---|---|---|
| 5,916,855 A | 6/1999 | Avanzino et al. | |
| 6,270,393 B1 | 8/2001 | Kubota et al. | |
| 6,447,695 B1 | 9/2002 | Motonari | |
| 6,503,418 B2 | 1/2003 | Sahota et al. | |
| 6,524,168 B2 * | 2/2003 | Luo et al. | 451/41 |
| 6,607,424 B1 | 8/2003 | Costas et al. | |
| 6,838,016 B2 * | 1/2005 | Sakai et al. | 252/79.1 |
| 6,852,632 B2 * | 2/2005 | Wang et al. | 438/692 |
| 6,866,792 B2 * | 3/2005 | Small et al. | 252/79.1 |
| 7,241,725 B2 * | 7/2007 | Bian | 510/175 |
| 2001/0008828 A1 | 7/2001 | Uchikura et al. | |
| 2002/0017630 A1 | 2/2002 | Uchida et al. | |
| 2002/0037642 A1 * | 3/2002 | Wake et al. | 438/633 |
| 2002/0095872 A1 * | 7/2002 | Tsuchiya et al. | 51/307 |
| 2002/0098701 A1 | 7/2002 | Hasegawa | |
| 2002/0111024 A1 * | 8/2002 | Small et al. | 438/689 |
| 2002/0189169 A1 | 12/2002 | Costas et al. | |
| 2003/0061766 A1 | 4/2003 | Vogt et al. | |
| 2003/0116445 A1 | 6/2003 | Sun et al. | |
| 2003/0162399 A1 | 8/2003 | Singh | |
| 2003/0170991 A1 * | 9/2003 | Wang et al. | 438/692 |
| 2003/0181345 A1 | 9/2003 | Bian | |
| 2003/0219982 A1 | 11/2003 | Kurata et al. | |
| 2004/0115944 A1 | 6/2004 | Matsui | |
| 2005/0026444 A1 * | 2/2005 | Babu et al. | 438/697 |
| 2005/0070211 A1 * | 3/2005 | Bian | 451/36 |
| 2005/0136671 A1 * | 6/2005 | Goldberg et al. | 438/691 |
| 2005/0173669 A1 * | 8/2005 | Kurata et al. | 252/79.1 |
| 2006/0207635 A1 * | 9/2006 | Bian | 134/42 |

FOREIGN PATENT DOCUMENTS

| | | |
|---|---|---|
| EP | 1 096 556 A1 | 5/2001 |
| EP | 1 205 965 A1 | 5/2002 |
| WO | WO 03/072670 A1 | 9/2003 |

\* cited by examiner

*Primary Examiner* — Lan Vinh
(74) *Attorney, Agent, or Firm* — Blake T. Biederman

(57) ABSTRACT

The polishing solution is useful for removing a barrier from a semiconductor substrate. The solution contains by weight percent 0.001 to 25 oxidizer, 0.0001 to 5 anionic surfactant, 0 to 15 inhibitor for a nonferrous metal, 0 to 40 abrasive, 0 to 20 complexing agent for the nonferrous metal, 0.01 to 12 barrier removal agent selected from imine derivative compounds, hydrazine derivative compounds and mixtures thereof, and water; and the solution has an acidic pH.

9 Claims, No Drawings

SELECTIVE BARRIER SLURRY FOR CHEMICAL MECHANICAL POLISHING

BACKGROUND OF THE INVENTION

This invention relates to polishing of semiconductor wafers and, more particularly, to compositions and methods for removing wafer layers, such as, barrier materials in the presence of another layer.

Typically, semiconductor substrates have a silicon base and dielectric layers containing multiple trenches arranged to form a pattern of circuit interconnects within the dielectric layer. These trench patterns have either a damascene structure or dual damascene structure. In addition, typically one to as many as three or more capping layers coat the trench patterned dielectric layer with a barrier layer covering the capping layer or capping layers. Finally, a metal layer covers the barrier layer and fills the patterned trenches. The metal layer forms circuit interconnects that connect dielectric regions and form an integrated circuit.

The capping layers can serve different purposes. For example, a capping layer, such as, silicon carbide nitride coating dielectrics, may act as a polishing stop to protect underlying dielectrics from removal during polishing. The silicon carbide nitride's nitrogen concentration varies with manufacturer; and it may contain up to approximately 50 atomic percent nitrogen—if the nitride content is zero, then the stopping layer has a chemistry of silicon carbide. In addition, a silicon dioxide layer, silicon nitride layer or a combination of the two layers, may correct topography above the stopping layer. Typically, a barrier layer, such as a tantalum or tantalum nitride barrier layer, coats the capping layer and a metal conductive layer covers the barrier layer to form the interconnect metal.

Chemical mechanical planarization or CMP processes often include multiple polishing steps. For example, an initial planarization step removes a metal layer from underlying barrier dielectric layers to planarize the wafer. This first-step polishing removes the metal layer, while leaving a smooth planar surface on the wafer with metal-filled trenches that provide circuit interconnects planar to the polished surface. First-step polishing steps tend to remove excess interconnect metals, such as copper, at a relatively high rate. After the first-step polishing, a second-step polishing process typically removes a barrier that remains on the semiconductor wafer. This second-step polishing removes the barrier from its underlying dielectric layer to provide a planar polished surface on the dielectric layer. The second-step polishing may stop on a capping layer, remove all capping layers or remove some of the underlying dielectric layer.

Unfortunately, CMP processes often result in the excess removal of unwanted metal from circuit interconnects or "dishing". This dishing can result from, both first-step polishing and second-step polishing. Dishing in excess of acceptable levels causes dimensional losses in the circuit interconnects. These thin areas in the circuit interconnects attenuate electrical signals and can impair continued fabrication of dual damascene structures. In addition to dishing, the CMP processes often remove excessive amounts of the dielectric layer in an effect known as "erosion". Erosion that occurs adjacent to the interconnect metal can introduce dimensional defects in the circuit interconnects. Furthermore, erosion is a particular problem for low k and ultra-low k dielectrics. In a manner similar to dishing, these defects contribute to attenuation of electrical signals and impair subsequent fabrication of dual damascene structures.

After removing the barrier layer and any undesired capping layers, a first capping layer stop, such as a silicon carbide nitride stopping layer, often prevents the CMP process from damaging the dielectric. This stopping layer typically protects the underlying dielectrics to avoid or alleviate dielectric erosion by controlling removal rate. The removal rates of the barrier and other capping layers (such as, silicon nitride and silicon dioxide), versus, a removal rate of the stopping layer are examples of selectivity ratios. For purposes of this application, selectivity ratio refers to the ratio in removal rate as measured in angstroms per minute.

There is an unsatisfied demand for a composition that selectively removes barrier materials and capping materials (such as, silicon nitride and silicon dioxide) without removing excessive amounts of dielectric layers, such as low k dielectric layers. In addition, there is a need for a slurry that polishes semiconductor wafers as follows: removes barrier materials; reduces interconnect dishing, reduces dielectric erosion; avoids peeling of the dielectric; and operates with or without a silicon carbide-nitride stopping layer.

STATEMENT OF THE INVENTION

The invention provides a solution useful for removing a barrier from a semiconductor substrate comprising by weight percent 0.001 to 25 oxidizer, 0.0001 to 5 anionic surfactant, 0 to 15 inhibitor for a nonferrous metal, 0 to 40 abrasive, 0 to 20 complexing agent for the nonferrous metal, 0.01 to 12 barrier removal agent selected from imine derivative compounds, hydrazine derivative compounds and mixtures thereof, and water; and the solution has an acidic pH.

In another aspect, the invention provides a solution useful for removing a barrier from a semiconductor substrate comprising by weight percent 0.01 to 20 oxidizer, 0.001 to 2 anionic surfactant, 0.001 to 15 inhibitor for a nonferrous metal, 0 to 25 abrasive, 0 to 10 complexing agent for the nonferrous metal, 0.1 to 10 barrier removal agent selected from imine derivative compounds, hydrazine derivative compounds and mixtures thereof, and water; and the solution has an acidic pH of greater than 2.

In another aspect, the invention provides a method of removing a tantalum-containing barrier from a semiconductor substrate comprising the step of polishing the semiconductor substrate with a polishing solution, the solution comprising by weight percent 0.001 to 25 oxidizer, 0.0001 to 5 anionic surfactant, 0 to 15 inhibitor for a nonferrous metal, 0 to 40 abrasive, 0 to 20 complexing agent for the nonferrous metal, 0.01 to 12 barrier removal agent selected from imine derivative compounds, hydrazine derivative compounds and mixtures thereof, and water; and the solution has an acidic pH.

DETAILED DESCRIPTION

The slurry and method provide unexpected selectivity for removing barrier materials, such as tantalum, tantalum nitride and other tantalum-containing materials, while not removing excess low k materials, such as carbon-doped oxide (CDO). The slurry relies upon anionic surfactants to selectively remove tantalum, tantalum nitride and, tantalum-containing barrier layers while stopping or removing a silicon nitride or silicon carbide nitride layer. This selectivity reduces dishing of interconnect metal and erosion of dielectric layers. Furthermore, the slurry can remove barrier materials and capping layers such as, silicon nitride, organic caps and dielectrics without peeling or delaminating fragile low-k dielectric layers from semiconductor wafers. Another benefit of these slurries is the composition's ability to stop at silicon carbon doped oxide (CDO) layers.

A surface active agent or surfactant, as used in this specification refers to a substance that, when present, has the property of adsorbing onto the wafer substrate's surface or interfaces or alters the surface free energy of the wafer substrate's surface or interfaces. The term "interface" is a boundary between any two immiscible phases. The term "surface" denotes an interface where one phase is gas, usually air. Surfactants usually act to reduce interfacial free energy.

The anionic surfactants have a characteristic molecular structure having a structural group that has very little attraction for water known as a hydrophobic group, together with a group that has a strong attraction for water, called a hydrophilic group. The anionic surfactant has a hydrophilic group that has a negative ionic charge when it is ionized in a solution. The hydrophobic groups usually are long chain hydrocarbons, fluorocarbons or siloxane chains that have a length suitable for aqueous solubility. In particular, the hydrophobic groups have a carbon chain length of greater than three. Most advantageously, the hydrophobic group has a carbon chain length of at least six.

The preferred anionic surfactants contain a chemical group selected from at least one of carboxylate (carboxylic acid salt), sulfonate (sulfonic acid salt), sulfate (sulfuric acid salt), or phosphate (phosphoric and polyphosphoric acid ester). The hydrophilic part of the surfactant may contain one or more nitrogen atoms or one or more oxygen atoms or mixture thereof, but it contains at least one of the ionizable groups to provide solubility. The hydrophobic part of the anionic surfactants in this invention has at least five or more carbons to provide sufficient hydrophobicity. The hydrophobic portion can be either a straight chain, a branched chain or cyclic chain. The hydrophobic portion may be a saturated chain, unsaturated chain or contain an aromatic group.

Typically, the high selectivity can be achieved by addition of 0.0001 to 5 wt % of the surfactant. This specification refers to all concentrations in weight percent, unless specifically referenced otherwise. Furthermore, the disclosed ranges include combining and partially combining ranges and limits within ranges. Preferably, the surfactant is 0.001 to 2 wt %; and most preferably, the surfactant is 0.01 to 1 wt %.

Surfactants include those anionic surfactants selected from at least one of alkyl glutamates, dodececybenzenesulfonate, alkyl α-olefin sulfonates, dialkyl sulfosuccinates, alkylsulfonates, alkyl amphohydroxylypropyl sulfonates, alkylhydroxyethylimidazolines, alkyl amidopropyl betaines, methyl alkyltaurate, alkyl imidazoline and mixtures thereof. Particular surfactants include those anionic surfactants selected from at least one of methyl cocoyltaurate, dicyclohexyl sulfosuccinate (1,4-dicyclohexyl sulfonatosuccinate), dinonyl sulfosuccinate, cocoamphohydroxypropylsulfonate, C14-17 alkyl sec sulfonate, isostearylhydroxyethylimidazoline, cocamidopropyl betaine imidazoline C8/C10, C14-16 olefin sulfonate (dodecylbenzenesulfonate), hydrogenated tallow glutamate, POE (4) oleyl ether phosphate, lauryl sulfosuccinate, dodecylbenzenesulfonate and mixtures thereof. Typically, these surfactants are added as ammonium, potassium or sodium salts. Most preferably, the surfactant is added as an ammonium salt for high-purity formulations.

The anionic surfactant preferably suppresses removal rate of silicon carbide-nitride (SiCN) layer carbon-doped oxide (CDO) or both (as measured in angstroms per minute) in a greater differential rate than it suppresses removal rate of a barrier film, such as tantalum (Ta) or tantalum nitride (TaN). If we define the relative suppression ($\Delta X$) of removal rate of a film X as $\Delta X=(Xo-X)/Xo$, where Xo and X stand for the removal rates of X film, measured in angstroms per minute, before and after addition of the surfactant, the surfactants disclosed in this invention preferably satisfy at least one of the following equations (using TaN as an example): $\Delta(SiCN)>\Delta(TaN)$ or $\Delta(CDO)>\Delta(TaN)$, as measured with a microporous polyurethane polishing pad pressure measured normal to a wafer of 13.8 kPa (2 psi) and the conditions of the Examples. For example, when polishing at a pressure of 13.8 kPa and the conditions of the Examples with an IC1010™ polishing pad with a surfactant-free composition provides a control polishing rate (Xo) of 500 angstroms per minute for silicon carbide nitride and 500 angstroms per minute for tantalum nitride. Then adding the anionic surfactant reduces the polishing rates under the same conditions to 300 angstroms per minute for silicon carbide nitride and the removal rate for TaN must be larger than 300 angstroms per minute in order to satisfy the above selectivity equation.

Adjusting pH level and oxidizer concentration facilitate increased barrier removal rates for polishing solutions containing imine and hydrazine derivative compounds. In addition, the solution and method provide unexpected selectivity and control for removing barrier materials. Although the surfactants function to provide selectivity with or without a barrier removal agent, the solution preferably relies upon a barrier removal agent selected from the group comprising imine and hydrazine derivative compounds and mixtures thereof to selectively remove barrier materials, such as tantalum-containing and titanium-containing barrier. The solution removes barrier materials with reduced dielectric erosion and reduced dishing, erosion and scratching of the metal interconnects, such as copper. Furthermore, the solution removes tantalum barrier materials without peeling or delaminating low-k dielectric layers from semiconductor wafers. In addition, the solution can have a controlled TEOS removal rate for hardmasks formed from silicon dioxide deposited from tetraethylorthosilicate (TEOS) precursors.

In particular, the solution includes a barrier removal agent to remove barrier materials, such as, tantalum, tantalum nitride, tantalum-silicon nitrides and other tantalum-containing barrier materials. Although the solution is effective for titanium-containing barrier materials at acidic pH levels, the solution has particular effectiveness for tantalum-containing materials. For purposes of the specification, tantalum containing materials include tantalum, tantalum-base alloys and tantalum internetallics, such as tantalum carbides, nitrides and oxides. The slurry is most effective for removing tantalum-containing barriers from patterned semiconductor wafers.

Preferred imine derivatives include compounds of formula (I):

where $R^1$ is —H or —$NH_2$ and $R^2$ is —H, —$NH_2$, a hydrocarbon group, an amino group, a carbonyl group, an imido group, an azo group, a cyano group, a thio group, or a seleno group and —$OR^7$ where $R^7$ is a hydrocarbon group.

Preferred hydrazine derivatives include compounds of formula (II):

and where $R^3$, $R^4$, $R^5$, and $R^6$ are independently —H, —$OR^7$, —$NH_2$, a hydrocarbon group, a carbonyl group, an imido group, an azo group, a cyano group, a thio group, or a seleno group.

Example imine derivatives include acetamidine, acetamidine salts, acetamidine derivatives, arginine, arginine salts, argine derivatives, formamidine, formamidine salts, formamidine derivatives, guanidine derivatives, guanidine salts and mixtures thereof. Preferred imine derivatives of formula (I) include, for example, acetamidine hydrochloride, aminoguanidine hydrochloride, arginine, formanimide, formamidinesulfinic acid, formamidine acetate, 1,3-diphenyl guanidine, 1-methyl-3-nitroguanidine, guanidine hydrochloride, tetramethylguanidine, 2,2-azobis (dimethyl-propionamidine)di-HCl, guanidine sulfate, guanidine acetic acid, guanidine carbonate, guanidine nitrate and mixtures thereof.

Preferred hydrazine derivatives of formula (II) include, for example, carbohydrazide, acetic hydrazide, semicarbazide hydrochloride, 1,2-diformylhydrazine, methylhydrazinocarboxylate, oxalic dihydrazide, acetone azine and formic hydrazide and mixtures thereof.

The imine derivative compounds of formula (I) preferably contain an electron-donating substituent as $R^1$ or $R^2$, and are free of electron-withdrawing substituents. More preferably, one of $R^1$ and $R^2$ is an electron-donating substituent, and the other substituent is either hydrogen or an electron-donating substituent. If two electron-donating substituents are present in an imine derivative compound, the substituents may be the same, or they may be different.

Hydrazine derivative compounds of formula (II) preferably contain a hydrazine functionality (>N—$NH_2$) and contain no more than one electron-withdrawing substituent. A hydrazine functionality is provided when $R^3$ and $R^4$ are both hydrogen, or when $R^5$ and $R^6$ are both hydrogen.

For purposes of the specification, the term "electron-donating" refers to a chemical group bonded to a substance that transfers electron density to that substance. F. A. Carey and R. J. Sundberg, in *Advanced Organic Chemistry, Part A: Structure and Mechanisms*, $3^{rd}$ *Edition* New York: Plenum Press (1990), p. 208 and 546-561 provide a more detailed description of electron-donating substituents. The imine derivative compounds have an electron-donating substituent that transfers sufficient electron density to the substance to establish a measurable partial negative e charge on the substituent. Electron-donating substituents include, for example, amino, hydroxyl (—OH), alkyl, substituted alkyl, hydrocabon radical, substituted hydrocarbon radical, amido, and aryl. These electron-donating substituents accelerate removal of tantalum-containing barrier materials.

In addition, abrasive additions render imine and hydrazine derivative compounds effective with electron-withdrawing substituents. The term "electron-withdrawing" refers to a chemical group bonded to a substance that transfers electron density away from that substance. Electron-withdrawing substituents transfer sufficient electron density away from the substance to establish a measurable partial positive charge on the substituent and do not accelerate barrier removal. Electron-withdrawing substituents include, for example, —O-alkyl; -halogen; —C(=O)H; —C(=)O-alkyl; —C(=O)OH; —C(=O)-alkyl; —$SO_2H$; —$SO_3H$; and —$NO_2$. The carbonyl groups that are electron-withdrawing are not amide groups.

The tantalum barrier removal agent may be acetamidine, acetamidine salts, acetamidine derivatives, arginine, arginine salts, argine derivatives, formamidine, formamidine salts, formamidine derivatives, guanidine derivatives, guanidine salts and mixtures thereof. These barrier removal agents appear to have a strong affinity for tantalum barrier materials and titanium-containing materials at acidic pH levels. This affinity appears to accelerate the barrier removal rate with limited abrasive or optionally, without the use of any abrasives. This limited use of abrasive allows the polishing to remove the tantalum barrier at a rate greater than the dielectric and the metal interconnect. The solution relies upon a tantalum barrier removal agent selected from the group comprising formamidine, formamidine salts, formamidine derivatives, such as guanidine, guanidine derivatives, guanidine salts and a mixture thereof to selectively remove tantalum barrier materials. Particular effective barrier removal agents include guanidine, guanidine hydrochloride, guanidine sulfate, amino-guanidine hydrochloride, guanidine acetic acid, guanidine carbonate, guanidine nitrate, formamidine, formamidinesulfinic acid, formamidine acetate and mixtures thereof. Preferably, the solution contains 0.01 to 12 weight percent barrier removal agent. Most preferably, the solution contains 0.1 to 10 weight percent barrier removal agent and for most applications, barrier removal agent concentrations between 0.1 and 4 weight percent provide sufficient barrier removal rates.

The barrier removal agent provides efficacy in acidic polishing solutions containing water. Preferably, the solution has a pH above 2 with a balance water. The useful pH range extends at least from 2 to 7. Preferably, the solution has a pH between 2 and 7. Most preferably, the solutions pH is between 3 and 5. Typical agents for adjusting pH downward include nitric acid, sulfuric acid, hydrochloric acid, phosphoric acid and organic acids. Most preferably, potassium hydroxide and nitric acid provide final pH adjustments, as required. In addition, the solution most preferably relies upon a balance of deionized water to limit incidental impurities.

At pH levels below 7, an oxidizer facilitates barrier removal. The composition contains 0.001 to 25 weight percent oxidizer. The oxidizer is particularly effective in allowing operation of the slurry at acidic pH levels. Preferably, the solution contains 0.001 to 20 weight percent oxidizer. Most preferably, the solution contains 0.01 to 5 weight percent oxidizer. The oxidizing agent can be at least one of a number of oxidizing compounds, such as hydrogen peroxide, monopersulfates, iodates, magnesium perphthalate, peracetic acid, persulfates, bromates, perbromates, perchlorates, periodates, ferric nitrate, iron salts, cerium salts, Mn (III) salts, Mn(IV) salts and Mn (VI) salts, silver salts, copper salts, chromium salts, cobalt salts, halogens, hypochlorites and mixtures thereof. Furthermore, it is often advantageous to use a mixture of oxidizer compounds. Preferably, the oxidizer is either hydrogen peroxide or iodate. When the polishing slurry contains an unstable oxidizing agent, such as, hydrogen peroxide, it is often most advantageous to mix the oxidizer into the slurry at the point of use. The most advantageous oxidizer is hydrogen peroxide.

Suitable metals used for the interconnect include, for example, copper, copper alloys, gold, gold alloys, nickel, nickel alloys, platinum group metals, platinum group metal alloys, silver, silver alloys, tungsten, tungsten alloys and mixtures comprising at least one of the foregoing metals. The preferred interconnect metal is copper. In acidic polishing compositions and slurries that utilize oxidizers such as hydrogen peroxide, both the copper removal rate and the static etch rate are high primarily because of oxidation of the copper. In order to reduce the removal rate of the interconnect metal the polishing composition employs a corrosion inhibitor. The corrosion inhibitors function to reduce removal of the interconnect metal. This facilitates improved polishing performance by reducing the dishing of the interconnect metal.

The inhibitor is optionally present in an amount of 0 to 15 wt %—the inhibitor may represent a single or a mixture of inhibitors to the interconnect metal. Within this range, it is desirable to have an amount of inhibitor equal to or greater than 0.001 wt %, preferably greater than or equal to 0.05 wt %. Also desirable within this range is an amount of less than or equal to 4 wt %, preferably less than or equal to 1 wt %. The preferred corrosion inhibitor is benzotriazole (BTA). In one embodiment, the polishing composition may contain a relatively large quantity of BTA inhibitor for reducing the interconnect removal rate. At BTA concentrations above 0.05 wt %, an addition of supplemental corrosion inhibitors may be unnecessary. The preferred concentration of BTA is an amount of 0.0025 to 2 wt %.

In addition to the inhibitor, the solution optionally may contain 0 to 20 weight percent complexing agent for the nonferrous metal. The complexing agent, when present, prevents precipitation of the metal ions formed by dissolving the nonferrous metal interconnects. Most advantageously, the solution contains 0 to 10 weight percent complexing agent for the nonferrous interconnect metals. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, glutaric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, salts and mixtures thereof. Advantageously, the complexing agent is selected from at least one of acetic acid, citric acid, ethyl acetoacetate, glycolic acid, lactic acid, malic acid, oxalic acid and mixtures thereof. Most advantageously, the complexing agent is citric acid.

Although the nitrogen-containing polishing agents provide efficacious abrasive-free polishing fluids, it may be desirable to add an abrasive to the polishing fluid in some applications. The polishing composition may optionally contain up to 40 wt % abrasive (preferably, 0 to 25 wt %) to facilitate barrier removal or combined barrier and silica removal—depending upon the integration scheme, the polishing composition may serve to i) remove the mask layer or film underlying the barrier layer; or ii) to first remove a barrier layer and then remove a silicon oxide-containing layer. The polishing composition optionally includes an abrasive for "mechanical" removal of barrier layers. The abrasive is preferably a colloidal abrasive. Example abrasives include inorganic oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides such as polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is silica.

Advantageously, the abrasive is present in an amount of 0.05 to 15 wt % based on the total weight of the polishing composition. Within this range, it is desirable to have the abrasive present in an amount of greater than or equal to 0.1 wt %, and preferably greater than or equal to 0.5 wt %. Also desirable within this range is an amount of less than or equal to 10 wt %, and preferably less than or equal to 5 wt %.

The abrasive has an average particle size of less than or equal to 150 nanometers (nm) for preventing excessive metal dishing and dielectric erosion. For purposes of this specification, particle size refers to the average particle size of the abrasive. It is desirable to use a colloidal abrasive having an average particle size of less than or equal to 100 nm, preferably less than or equal to 50 nm. The least dielectric erosion and metal dishing preferably occurs with colloidal silica having an average particle size of less than or equal to 40 nm. Decreasing the size of the colloidal abrasive to less than or equal to 40 nm, tends to improve the selectivity of the polishing composition; but it also tends to decrease the barrier removal rate. In addition, the preferred colloidal abrasive may include additives, such as dispersants, surfactants and buffers to improve the stability of the colloidal abrasive at acidic pH ranges. One such colloidal abrasive is colloidal silica from Clariant S. A., of Puteaux, France. The chemical mechanical planarizing composition can also optionally include brighteners, such as, ammonium chloride, pH buffers, biocides and defoaming agents.

If the polishing composition does not contain abrasives, then pad selection and conditioning become more important to the chemical mechanical planarizing (CMP) process. For example, for some abrasive-free compositions, a fixed abrasive pad improves polishing performance.

The slurry can provide a TaN/SiCN and TaN/CDO selectivity of at least 2 to 1 as measured with a microporous polyurethane polishing pad pressure measured normal to a wafer of less than 13.8 kPa. A particular polishing pad useful for determining selectivity is the microporous polyurethane polishing pad, such as the IC1000™ polishing pad sold by Rohm and Haas Electronic Materials CMP Technologies. Advantageously, the slurry provides the selectivity of at least 2 to 1 for TaN/CDO as measured with a microporous polyurethane polishing pad pressure measured normal to a wafer of less than 13.8 kPa; and most advantageously, this range is at least 5 to 1 for TaN/CDO. Adjusting the surfactant concentration, slurry pH, oxidizer concentration and tantalum removal agent concentrations adjust the selectivities. Adjusting the inhibitor, oxidizer, complexing agent adjusts the removal rate of the interconnect metals.

EXAMPLES

All the testing was at room temperature and employed 200 mm wafers. Tests employed the following sheet wafers; TEOS $SiO_2$, electroplated copper, CDO® (a carbon doped oxide low-k wafer manufactured by SemiTech, tantalum nitride, tantalum, SiCN and SiN.

Polishing was done on a Strasbaugh 6EC employing IC1010 or Politex® polishing pads manufactured by Rohm and Haas Electronic Materials CMP Technologies. The polishing downforce was 2 psi (13.8 kPa) unless otherwise indicated. A Kinik diamond abrasive conditioning disk ("1508070" 150 micron diamond size, 80 micron protrude height and 70 micron space between diamonds) maintained the polishing pad's surface roughness. Platen and carrier speeds were 120 and 114 rpm, respectively. Slurry flow rate was 200 ml/min. Removal rate was calculated from the film thickness difference before and after polishing divided by the polish time. Thickness measurements for TEOS, CDO®, SiCN and SiN were done with a Therma Wave Optiprobe 2600 and employed 49 mapped points. Tantalum nitride, tantalum and copper thickness measurements were done on a CDE and employed 91 mapped points. All the reported removal rates are in units of Å/min. Polishing time was 60 seconds, but increased to 120 seconds for low removal rate formulations to improve accuracy.

In the examples, pH 3.5 was used for the slurries. The slurries contain at least 0.4 wt % guanidine hydrogenchloride (GHC) for increasing TaN and Ta removal rates. A 0.5 wt % $H_2O_2$ was added for enhancing the TaN and Ta removal rate with GHC at the low pH levels. Benzotriazole at 0.1 wt % was sufficient to prevent excessive corrosion of the copper surface. The abrasive was 3 wt % silica (PL150H25, 25 nm average particle size from Clariant) because it has been shown that 25 nm particle size of silicon dioxide abrasive produces low surface defectivity. Although 3% abrasive was chosen, it is understood that more abrasive may be added if necessary—it is found, however, that above 3-4 wt % silica, abrasive surface defects may increase. For purposes of this specification, letters represent comparative examples and numbers represent the invention.

Sodium Methyl Cocoyltaurate Suppresses CDO, SiCN and SiN Removal Rates

From Table 1 it is seen that an addition of 0.2 wt % sodium methyl cocoyltaurate decreases the CDO removal rate from 200 to 30 Å/min. and SiCN from 640 to 28 Å/min, while the TaN rate has only about 15% drop in removal rate. The TEOS removal rate dropped from 390 to 240 Å/min. The data show that the rate changes satisfy the selectivity equations defined earlier in the specification.

Sodium Dicyclohexyl Sulfosuccinate Suppresses CDO, but not SiCN or SiN

In applications where SiN removal is crucial and CDO must be suppressed, sodium dicyclohexyl sulfosuccinate can be used.

Sulfosuccinate Suppresses CDO and SiCN Rates, but not SiN Removal Rate

Sulfosuccinate is a surfactant with a functionality between that of sodium dicyclohexyl sulfosuccinate and sodium methyl cocoyltaurate. It suppresses CDO and partially suppresses SiN (only at a higher concentration). For SiCN sup-

TABLE 1

Removal rates by formulation with anionic surfactants

| Sample | BTA Wt % | $H_2O_2$ Wt % | Silica Wt % | pH | Sodium Methyl Cocoyltaurate Wt % | GHC Wt % | TaN Å/min | TEOS Å/min | CDO Å/min | SiCN Å/min | Cu Å/min | SiN Å/min | Ta Å/min |
|---|---|---|---|---|---|---|---|---|---|---|---|---|---|
| A | 0.1 | 0.5 | 3 | 3.5 | 0 | 0.4 | 1925 | 389 | 195 | 643 | 103 | 593 | 1205 |
| 1 | 0.1 | 0.5 | 3 | 3.5 | 0.05 | 0.4 | 1641 | 253 | 46 | 46 | 89 | 27 | 506 |
| 2 | 0.1 | 0.5 | 3 | 3.5 | 0.1 | 0.4 | 1621 | 254 | 42 | 36 | 65 | 23 | 460 |
| 3 | 0.1 | 0.5 | 3 | 3.5 | 0.2 | 0.4 | 1649 | 243 | 33 | 28 | 79 | 20 | 426 |
| | | | | | Sodium Dicyclohexyl Sulfosuccinate | | | | | | | | |
| A | 0.1 | 0.5 | 3 | 3.5 | 0 | 0.4 | 1925 | 389 | 195 | 643 | 103 | 593 | 1205 |
| 4 | 0.1 | 0.5 | 3 | 3.5 | 0.05 | 0.4 | 1856 | 342 | 93 | 409 | 96 | 604 | Clear |
| 5 | 0.1 | 0.5 | 3 | 3.5 | 0.2 | 0.4 | 1686 | 313 | 75 | 290 | 115 | 638 | 176 |
| 6 | 0.1 | 0.5 | 3 | 3.5 | 0.3 | 0.4 | 1754 | 302 | 85 | 266 | 162 | 632 | 800 |
| 7 | 0.1 | 0.5 | 3 | 3.5 | 0.5 | 0.4 | 1699 | 261 | 93 | 237 | 133 | 580 | 471 |
| | | | | | Sodium Dinonyl Sulfosuccinate | | | | | | | | |
| A | 0.1 | 0.5 | 3 | 3.5 | 0 | 0.4 | 1925 | 389 | 195 | 643 | 103 | 593 | 1205 |
| 8 | 0.1 | 0.5 | 3 | 3.5 | 0.05 | 0.4 | 1794 | 326 | 141 | 58 | 80 | 530 | Clear |
| 9 | 0.1 | 0.5 | 3 | 3.5 | 0.1 | 0.4 | 1633 | 305 | 91 | 105 | 121 | 488 | 610 |
| 10 | 0.1 | 0.5 | 3 | 3.5 | 0.2 | 0.4 | 1696 | 280 | 63 | 63 | 61 | 43 | 742 |
| 11 | 0.1 | 0.5 | 3 | 3.5 | 0.3 | 0.4 | 1483 | 284 | 76 | 59 | 94 | 54 | 686 |
| | | | | | Sodium Coco-amphohydroxy-propylsulfonate | | | | | | | | |
| A | 0.1 | 0.5 | 3 | 3.5 | 0 | 0.4 | 1925 | 389 | 195 | 643 | 103 | 593 | 1205 |
| 12 | 0.1 | 0.5 | 3 | 3.5 | 0.05 | 0.4 | 1531 | 269 | 66 | 306 | 166 | 511 | Clear |
| 13 | 0.1 | 0.5 | 3 | 3.5 | 0.100 | 0.4 | 1066 | 199 | 49 | 245 | 330 | 307 | 407 |
| 14 | 0.1 | 0.5 | 3 | 3.5 | 0.2 | 0.4 | 461 | 177 | 63 | 141 | 326 | 178 | Clear |
| | | | | | Sodium C14-17 alkyl sec sulfonate | | | | | | | | |
| A | 0.1 | 0.5 | 3 | 3.5 | 0 | 0.4 | 1925 | 389 | 195 | 643 | 103 | 593 | 1205 |
| 15 | 0.1 | 0.5 | 3 | 3.5 | 0.050 | 0.4 | 1474 | 257 | 78 | 349 | 96 | 432 | 697 |
| 16 | 0.1 | 0.5 | 3 | 3.5 | 0.200 | 0.4 | 1437 | 242 | 69 | 69 | 64 | 43 | 636 |
| 17 | 0.1 | 0.5 | 3 | 3.5 | 0.350 | 0.4 | 1460 | 254 | 45 | 60 | 37 | 40 | 670 |
| 18 | 0.1 | 0.5 | 3 | 3.5 | 0.500 | 0.4 | 1185 | 238 | 68 | 51 | −17 | 44 | 721 |

Sodium Methyl Cocoyltaurate was Geropon TC-270 from Rhodia USA, structure of RCO-NCH$_3$CH$_2$CH$_2$SO$_3$Na, RCO- rep. coconut acid radical.
Sodium dicyclohexyl sulfosuccinate was Gemtex ® 691-40 from Finetex Inc. (Sodium 1,4-dicyclohexyl sulfonatosuccinate).
Sodium Dinonyl Sulfosuccinate was Geropon WS-25/I from Rhodia USA.
Sodium Cocoamphohydroxypropylsulfonate was Mackam CS from McIntyre Group Ltd, structure of RCO-NH(CH$_2$)$_6$N(OH)$_2$CHSO$_3$Na, RCO- represents the coconut acid radical.
Sodium C14-17 alkyl sec sulfonate was Hostapur SAS 30 from Clariant Corp.
Silica was PL150H25 from Clariant Corp. having an average particle diameter of 25 nm.
GHC represents guanidine hydrochloride.

pression, it is not as good as sodium methyl cocoyltaurate, but much better than sodium dicyclohexyl sulfosuccinate. Sulfosuccinate suppresses SiN only at certain concentration and above, and below that concentration there is almost no suppression effect on SiN. Sulfosuccinates in structure are very similar to that of sodium dicyclohexyl sulfosuccinate, except that they have different groups for esterization (cyclohexyl and nonyl, respectively).

Other Additives have Either One of Above Suppression Effects

Cocoamphohydroxylpropylsulfonate, is another cocoyl-based anionic surfactant, such as sodium methyl cocoyltaurate. However, cocoamphohydroxylpropylsulfonate is not as good as sodium methyl cocoyltaurate in suppression of CDO, SiCN or SiN. This difference appears to be due to the head (hydrophilic) group. The difference between the two surfactants is highlighted in the following: RCO—NH(CH$_2$)$_6$N(OH)$_2$CHSO$_3$Na (sodium cocoamphohydroxypropylsulfonate) and RCO—NCH$_3$CH$_2$CH$_2$SO$_3$Na (sodium methyl cocoyltaurate). It is seen that the head group of sodium cocoamphohydroxypropylsulfonate is more hydrophilic than that of sodium methyl cocoyltaurate. Thus, it appears that a more hydrophobic surfactant is more effective in the suppression.

Sodium C14-17 alkyl sec sulfonate was good at suppressing CDO, SiCN and SiN as seen in Table 1. This surfactant has a secondary alkyl group that may act as a wetting agent to low k patterned wafers. This can be especially important for low k barrier slurries.

Table 2 below provides a secondary screening of anionic surfactants.

TABLE 2

Removal rates by formulation with anionic surfactants

| Sample | BTA Wt % | H$_2$O$_2$ Wt % | Silica Wt % | pH | Isostearylhydroxy-ethylimidazoline Wt % | GHC Wt % | TaN Å/min | TEOS Å/min | CDO Å/min | SiCN Å/min | Cu Å/min | SiN Å/min | Ta Å/min |
|---|---|---|---|---|---|---|---|---|---|---|---|---|---|
| A | 0.1 | 0.5 | 3 | 3.5 | 0 | 0.4 | 1925 | 1389 | 195 | 643 | 103 | 593 | 1205 |
| 19 | 0.1 | 0.5 | 3 | 3.5 | 0.050 | 0.4 | 1129 | 74 | 38 | 77 | 99 | 19 | 432 |
| 20 | 0.1 | 0.5 | 3 | 3.5 | 0.200 | 0.4 | 16 | Broke | 15 | 31 | 118 | 7 | −3 |
| | | | | | Cocamidopropyl betaine | | | | | | | | |
| 21 | 0.1 | 0.5 | 3 | 3.5 | 0.050 | 0.4 | 681 | 135 | 245 | 127 | 118 | 136 | 379 |
| 22 | 0.1 | 0.5 | 3 | 3.5 | 0.200 | 0.4 | 258 | 156 | 54 | 91 | 98 | 74 | 126 |
| | | | PL150H25 | | C8/C10 Imidazoline | | | | | | | | |
| 23 | 0.1 | 0.5 | 3 | 3.5 | 0.050 | 0.4 | 1479 | 193 | 360 | 431 | 98 | 454 | 682 |
| 24 | 0.1 | 0.5 | 3 | 3.5 | 0.200 | 0.4 | 1019 | 118 | 403 | 188 | 339 | 150 | 435 |
| | | | | | Sodium dodecylbenzene sulfonate | | | | | | | | |
| 25 | 0.1 | 0.5 | 3 | 3.5 | 0.050 | 0.4 | 1696 | 248 | 66 | 49 | 151 | 42 | 697 |
| 26 | 0.1 | 0.5 | 3 | 3.5 | 0.200 | 0.4 | 1785 | 241 | 61 | 49 | 48 | 34 | 487 |
| | | | | | Sodium hydrogenated tallow glutamate | | | | | | | | |
| 27 | 0.1 | 0.5 | 3 | 3.5 | 0.050 | 0.4 | 1627 | 206 | 101 | 694 | 93 | 399 | 819 |
| 28 | 0.1 | 0.5 | 3 | 3.5 | 0.200 | 0.4 | 933 | 154 | 80 | 130 | 41 | 37 | 719 |
| | | | | | Sodium C14-16 Olefin Sulfonate | | | | | | | | |
| 29 | 0.1 | 0.5 | 3 | 3.5 | 0.050 | 0.4 | 1465 | 228 | 38 | 83 | 53 | 21 | 404 |
| 30 | 0.1 | 0.5 | 3 | 3.5 | 0.200 | 0.4 | 1463 | 231 | 32 | 22 | 62 | 15 | 315 |
| | | | | | POE (4) oleyl ether phosphate | | | | | | | | |
| 31 | 0.15 | 0.5 | 3 | 4 | 0.04 | 1 | 1428 | 242 | 165 | 350 | 341 | 544 | 414 |
| | | | | | Ammonium lauryl sulfosuccinate | | | | | | | | |
| 32 | 0.15 | 0.5 | 3 | 4 | 0.02 | 1 | 1887 | 225 | 78 | 160 | 218 | 542 | 464 |
| 33 | 0.15 | 0.5 | 4 | 4 | 0.03 | 1 | 1613 | 223 | 47 | 269 | 239 | 196 | 573 |
| 34 | 0.15 | 0.5 | 3 | 4 | 0.04 | 1 | 1372 | 167 | 100 | 84 | 262 | 118 | 485 |

Isostearylhydroxyethylimidazoline was Schercozoline I manufactured by Scher Chemicals, Inc.
Cocamidopropyl betaine (RCO-NH(CH$_2$)$_3$N$^+$(CH$_3$)$_2$CH$_2$COO$^-$) was Mackam 35-HP distributed by McIntyre Group Ltd.
Imidazoline C8/C10 was Amphoterge KJ-2 (C8/C10 imidazoline) manufactured by Lonza Ltd.
Sodium C14-16 olefin sulfonate (sodium dodecylbenzenesulfonate) was Bioterge AS-40 manufactured by Stepan Co.
Sodium hydrogenated tallow glutamate was Amisoft HS-11P(F) manufactured by Ajinomoto Co., Inc.
POE (4) oleyl ether phosphate was Hetphos manufactured by Global-Seven Inc.
Ammonium lauryl sulfosuccinate was Monamate LNT-40 manufactured by Uniqema Chemicals Ltd.
Sodium dodecylbenzenesulfonate was Biosoft D-40 from Stepan Co.
Silica was PL150H25 from Clariant Corp. having an average particle diameter of 25 nm.
GHC represents guanidine hydrochloride.

Referring to Table 2, a small amount of isostearylhydroxyethylimidazoline (Scherozoline I) appears to suppress everything except TaN and Ta removal rates. This design is particularly efficacious where the manufacturer does not require TEOS removal. Other surfactants illustrate an ability to selectively decrease removal rate of CDO and SiCN layers.

In addition, the solution and method optionally provide excellent selectivity for removing tantalum barrier materials such as tantalum, tantalum nitride and tantalum oxide and capping layers such as, silicon nitride and silicon oxide while stopping at the silicon carbide nitride layer. In addition, the solution selectively removes barrier layers, capping layers, dielectric layers, anti-reflective layers and hard masks while stopping at the silicon carbide nitride to protect underlying dielectrics and reduce or eliminate dielectric erosion. In addition, the composition includes the benefit of functioning to stop on either a silicon carbide nitride layer or a CDO layer. This allows a single slurry to serve multiple functions within a single integration scheme.

The invention claimed is:

1. A solution useful for removing a barrier from a semiconductor substrate, the semiconductor substrate containing tantalum nitride (TaN), copper and carbon-doped oxide (CDO), comprising by weight percent 0.001 to 25 oxidizer, 0.02 to 0.35 anionic surfactant, 0 to 15 inhibitor for a nonferrous metal, 0 to 40 abrasive, 0 to 20 complexing agent for the nonferrous metal, 0.01 to 12 barrier removal agent selected from formamidine, formamidine salts, formamidine derivatives, guanidine, guanidine derivatives, guanidine salts and mixtures thereof; and water; and the solution has an acidic pH and provides a TaN/CDO selectivity of at least 2 to 1 as measured with a microporous polyurethane polishing pad pressure measured normal to a wafer of less than 13.8 kPa.

2. The solution of claim 1 wherein the anionic surfactant contains a chemical group selected from at least one of carboxylate, sulfonate, sulfate and phosphate.

3. The solution of claim 1 wherein the anionic surfactant is selected from at least one of alkyl glutamates, dodecylbenzenesulfonate, alkyl α-olefin sulfonates, dialkyl sulfosuccinates, alkylsulfonates, alkyl amphohydroxylypropyl sulfonates, alkylhydroxyethylimidazolines, alkyl amidopropyl betaines, methyl alkyltaurate, alkyl imidazoline and mixtures thereof.

4. The polishing solution of claim 1 wherein the polishing solution is abrasive-free.

5. A solution useful for removing a barrier from a semiconductor substrate, the semiconductor substrate coutainin tantalum nitride (TaN) and carbon-doped (CDO), comprising by weight percent 0.01 to 20 oxidizer, 0.02 to 0.35 anionic surfactant, 0.001 to 15 inhibitor for a nonferrous metal, 0 to 25 abrasive, 0 to 10 complexing agent for the nonferrous metal, 0.1 to 10 barrier removal agent selected from formamidine, formamidine salts, formamidine derivatives, guanidine, guanidine derivatives, guanidine salts and mixtures thereof; and water; and the solution has an acidic pH of greater than 2 and provides a TaN/CDO selectivity of at least 2 to 1 as measured with a microporous polyurethane polishing pad pressure measured normal to a wafer of less than 13.8 kPa.

6. The solution of claim 5 wherein the anionic surfactant contains a chemical group selected from at least one of carboxylate, sulfonate, sulfate and phosphate.

7. The solution of claim 5 wherein the anionic surfactant is selected from at least one of alkyl glutamates, dodecylbenzenesulfonate, alkyl α-olefin sulfonates, dialkyl sulfosuccinates, alkylsulfonates, alkyl amphohydroxylypropyl sulfonates, alkylhydroxyethylimidazolines, alkyl amidopropyl betaines, methyl alkyltaurate, alkyl imidazoline and mixtures thereof.

8. The solution of claim 5 wherein the anionic surfactant is selected from at least one of methyl cocoyltaurate, dicyclohexyl sulfosuccinate (1,4-dicyclohexyl sulfonatosuccinate), dinonyl sulfosuccinate, cocoamphohydroxypropylsulfonate, C14-17 alkyl sec sulfonate, isostearylhydroxyethylimidazoline, cocamidopropyl betaine imidazoline C8/C10, C14-16 olefin sulfonate (dodecylbenzenesulfonate), hydrogenated tallow glutamate, POE (4) oleyl ether phosphate, lauryl, sulfosuccinate, dodecylbenzenesulfonate and mixtures thereof.

9. The polishing solution of claim 5 wherein the polishing solution is abrasive-free.

\* \* \* \* \*